United States Patent

Murasawa

[11] Patent Number: 5,841,188
[45] Date of Patent: Nov. 24, 1998

[54] TAPE CARRIER STRUCTURE FOR A TAPE CARRIER PACKAGE

[75] Inventor: Yasuhiro Murasawa, Tokyo, Japan

[73] Assignee: Mitsubishi Denki Kabushiki Kaisha, Tokyo, Japan

[21] Appl. No.: 562,511

[22] Filed: Nov. 24, 1995

[30] Foreign Application Priority Data

Aug. 17, 1995 [JP] Japan ................................. 7-209571

[51] Int. Cl.⁶ .......................... H01L 21/56; H01L 21/58; H01L 21/60
[52] U.S. Cl. .......................... 257/668; 257/676; 257/692; 257/735; 257/741; 257/773
[58] Field of Search .................... 438/111, 112, 438/123, 124, 125, 126, 611; 257/668, 676, 692, 735, 741, 773

[56] References Cited

U.S. PATENT DOCUMENTS

| | | | |
|---|---|---|---|
| 4,967,261 | 10/1990 | Niki et al. | 357/70 |
| 5,075,252 | 12/1991 | Schendelman | 437/207 |
| 5,409,866 | 4/1995 | Sato et al. | 438/123 |
| 5,446,313 | 8/1995 | Masuda et al. | 257/666 |
| 5,530,292 | 6/1996 | Waki et al. | 257/724 |
| 5,589,420 | 12/1996 | Russell | 437/220 |

*Primary Examiner*—David Graybill

[57] ABSTRACT

A tape carrier structure (T1,T2) for a tape carrier package on which at least one semiconductor chip (1) is mounted, the tape carrier structure (T1,T2) having a polyimide tape (3) and leads (2) joined onto the polyimide tape (3), an end of each of the leads (2) being connected to one of connecting pads corresponding thereto, the connecting pads being provided on the semiconductor chip (1), wherein the polyimide tape (3) has a facing portion (3a) which is situated so as to face to the semiconductor chip (1) except the connecting pads on condition that the semiconductor chip (1) is mounted on the tape carrier package.

15 Claims, 4 Drawing Sheets ns. 5,841,188

TAPE CARRIER STRUCTURE FOR A TAPE CARRIER PACKAGE

FIELD OF THE INVENTION

The present invention relates to a tape carrier structure used for a tape carrier package (TCP) on which at least one semiconductor chip is mounted.

DESCRIPTION OF THE PRIOR ART

Conventionally, there has been well known a tape carrier package on which at least one semiconductor chip is mounted. In FIGS. 3 to 6, there is shown a conventional process for manufacturing a tape carrier package on which semiconductor chips are mounted. In FIGS. 3 to 6, reference numerals 1, 2, 3, 4, 5 and 6 indicate, respectively, semiconductor chips, leads made of electrically conductive material (for example, copper, aluminum and so on), a polyimide tape (a tape made of polyimide), bumps made of electrically conductive material, adhesive materials and resin molds. Hereupon an assembly including the leads 2 and the polyimide tape 3 is referred to a tape carrier structure.

According to the conventional manufacturing technique of the tape carrier package, when a semiconductor chip 1 is mounted on the tape carrier package on a way of manufacturing step, at first aluminum connecting pads (not shown) provided on the semiconductor chip 1 are, electrically and mechanically, connected to the bumps 4 with solder or gold by the aid of a heating tool (not shown), each of the bumps 4 being joined to an inner end portion (semiconductor chip side) of the corresponding lead 2 adhered on the polyimide tape 3, as shown in FIG. 3.

Then, a part of the tape carrier structure around the semiconductor chip 1 and the semiconductor chip 1 are together molded by the resin mold 6 in order to protect the semiconductor chip 1, as shown in FIG. 4. FIG. 5, which is a top plan view of the tape carrier package after performing the molding step, shows the tape carrier package on which a plurality of semiconductor chips 1 are mounted in a row in the longitudinal direction of the polyimide tape 3, each of the semiconductor chips 1 being molded by the resin mold 6. Finally, an outer portion of each of the leads 2 is transformed so as to have a suitable shape by a transforming tool (not shown), as shown in FIG. 6, and then an unnecessary part of the outer portion is cut away by a suitable cutter (not shown) so that the tape carrier package on which the semiconductor chip(s) 1 is mounted is completed.

Hereupon, a tape carrier structure for a dual tape carrier package (DTP), in which some of a plurality of leads are connected to aluminum connecting pads disposed near a side of a semiconductor chip and the remainders of the leads are connected to aluminum connecting pads disposed near the opposite side of the semiconductor chip, is classified into two type structures, namely an A-type tape carrier structure as shown in FIG. 7 and a B-type tape carrier structure as shown in FIG. 8. As apparent from FIG. 7, in the A-type tape carrier structure, the leads are connected to the aluminum connecting pads disposed near the both shorter sides of the rectangular semiconductor chip. On the other hand, as apparent from FIG. 8, in the B-type tape carrier structure, the leads are connected to the aluminum connecting pads disposed near the both longer sides of the rectangular semiconductor chip. Thus, when the aluminum connecting pads are disposed near the shorter sides, the A-type tape carrier structure is preferably used, on the other hand, when the aluminum connecting pads are disposed near the longer sides, the B-type tape carrier structure is preferably used.

However, in the above-mentioned conventional tape carrier structure, there is such a problem that it is probable that the lead 2 and the semiconductor chip 1 make a short circuit at a position indicated by "A" so as to cause an incorrect wiring when the resin molding step is performed, as shown in FIG. 6. Namely, each of the leads 2, which is connected to the semiconductor chip 1 via the bump 4, is easily moved or transformed in upward and downward direction when a force is applied to the lead 2. Thus, when a part of the tape carrier structure around the semiconductor chip 1 and the semiconductor chip 1 are together molded by the resin mold 6 in the molding step, a force is applied to the lead 2 by the resin mold 6 so that it is probable that the lead 2 contacts to the semiconductor chip 1 at the position indicated by "A" in FIG. 6. Then, if the lead 2 contacts to the semiconductor chip 1, the tape carrier package becomes inferior.

Further, in the conventional tape carrier structure, there is also such a problem as follows. Namely, if the rectangular semiconductor chip 1 has the aluminum connecting pads to be connected to the leads at the both shorter sides thereof, the A-type tape carrier structure as shown in FIG. 7 is required, on the other hand, if the rectangular semiconductor chip 1 has the aluminum connecting pads at the both longer sides thereof, the B-type tape carrier structure as shown in FIG. 8 is required. Therefore, there are produced two kind of tape carrier packages which have different outer shapes or different location characteristics of the leads. Thus, since such different type of tape carrier packages exist, different type of layout patterns are required in a step of loading the tape carrier package to a substrate so that the loading step is very complicated.

SUMMARY OF THE INVENTION

The present invention has been developed to solve the above-mentioned conventional problems, and has an object of providing a tape carrier structure which can surely prevent the short circuit between the semiconductor chip and the lead. The present invention further has another object of providing a tape carrier structure which can simplify the step of loading the tape carrier package to the substrate.

Thus, according to a first aspect of the present invention, which is developed to achieve the above-mentioned objects, there is provided a tape carrier structure for a tape carrier package on which at least one semiconductor chip is mounted, the tape carrier structure comprising a polyimide tape and leads joined onto the polyimide tape, an end of each of the leads being to be connected to one of connecting portions of the semiconductor chip corresponding thereto, the connecting portions being provided on a surface of the semiconductor chip, characterized in that, the polyimide tape comprises a facing portion which is situated so as to face to the surface of the semiconductor chip except the connecting portions on condition that the semiconductor chip is mounted on the tape carrier package.

In the tape carrier package in which the tape carrier structure in accordance with the first aspect is used, since there is provided the facing portion made of polyimide between the leads and the semiconductor chip, each of the leads scarcely moves in upward and downward direction so as to be prevented from contacting to the semiconductor chip in time of molding step. Therefore, an occurrence of a short circuit between the semiconductor chip and each of the leads is surely prevented.

Further, in the tape carrier structure, since the leads do not contact the surface of the semiconductor chip except the connection portions, the leads can be disposed in any desired layout pattern (wiring pattern) without contacting to the semiconductor chip. Consequently, it becomes possible to mount the semiconductor chip on the tape carrier package with any desired situation (posture). Thus, it becomes possible to give an identical outer shape to the tape carrier packages on which semiconductor chips having different locations of connecting portions are mounted. Therefore, the step of loading the tape carrier package to a substrate is highly simplified.

Further, according to a second aspect of the present invention, in the tape carrier structure in accordance with the first aspect, preferably, an outer portion of each of the leads extends in a first direction of the polyimide tape, the connecting portions of the semiconductor chip are situated near an end of the semiconductor chip in regard to a second direction perpendicular to the first direction on condition that the semiconductor chip is mounted on the tape carrier package, and an inner portion of each of the leads extends in the second direction from one of the connecting portions corresponding thereto and then bends to the first direction so as to be united with the outer portion of one of the leads corresponding thereto.

Moreover, according to a third aspect of the present invention, in the tape carrier structure in accordance with the first aspect, preferably, each of the leads extends in a first direction of the polyimide tape, the connecting portions of the semiconductor chip are situated near an end of the semiconductor chip in regard to the first direction on condition that the semiconductor chip is mounted on the tape carrier package.

Further, according to a fourth aspect of the present invention, in the tape carrier structure in accordance with the second or third aspect, preferably, the first direction is substantially a width direction of the polyimide tape.

In addition, according to a fifth aspect of the present invention, in the tape carrier structure in accordance with any one of the above-mentioned aspects, the leads are preferably made of copper which has a good electrical conductivity and also is expensive.

Further, according to a sixth aspect of the present invention, in the tape carrier structure in accordance with any one of the above-mentioned aspects, some of the connecting portions are disposed near a side of the semiconductor chip, while remainders of the connecting portions are disposed near an opposite side of the side, and each of the leads is disposed so as to be connected to one of the connecting portions corresponding thereto. Namely, the tape carrier package in which the tape carrier structure according to this aspect is used, is referred to a dual tape carrier package (DTP).

Moreover, according to a seventh aspect of the present invention, in the tape carrier structure in accordance with any one of the above-mentioned aspects, a thickness of the polyimide tape is less than or equal to 50 $\mu$m. In this aspect, a thickness of the tape carrier package becomes much smaller (for example,less than or equal to 0.5 mm).

BRIEF DESCRIPTION OF THE DRAWINGS

These and other objects, features and advantages of the present invention will become clear from the following description taken in conjunction with the preferred embodiments with reference to the accompanying drawings throughout which like parts are designated by like reference numerals, and in which.

DETAILED DESCRIPTION OF THE PREFERRED EMBODIMENT

Figure 1A:
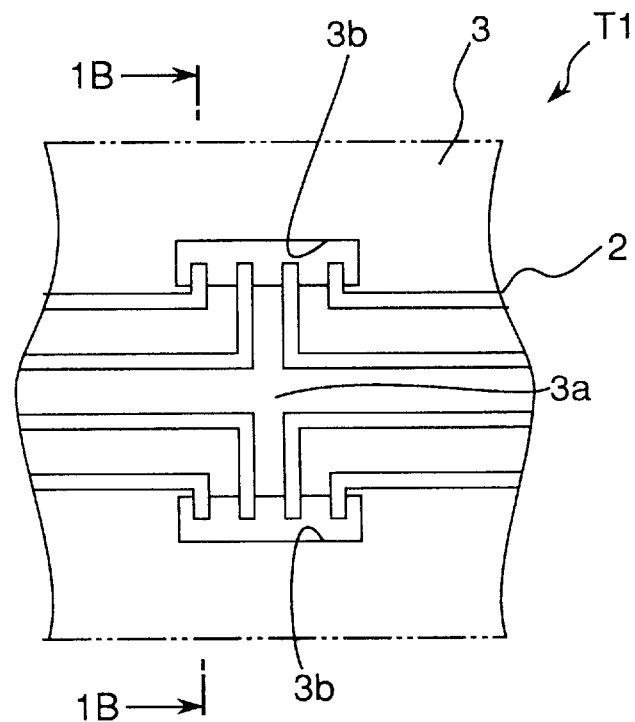
FIG. 1A is a top plan view of a tape carrier structure according to the present invention.
Figure 1B:
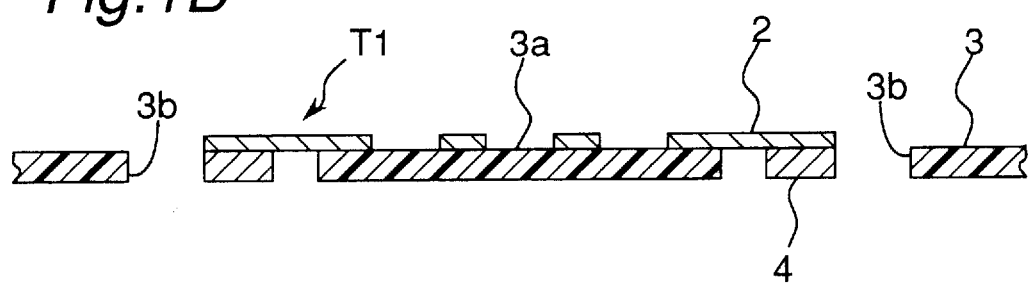
FIG. 1B is a sectional view along line 1B—1B of FIG. 1A illustrating the tape carrier structure.

Hereinafter, several preferred embodiments of the present invention will be concretely described with reference to the accompanying drawings. In the accompanying drawings, FIGS. 1A to 2C show the preferred embodiments of the present invention, while FIGS. 3 to 8 show the prior art in the technical field as formerly mentioned. In FIGS. 1A to 8, the duplicate or corresponding members have the same reference numerals.

As shown in FIGS. 1A to 2B, a tape carrier structure T1 for a tape carrier package (DTP) on which at least one semiconductor chip 1 is mounted, comprises a polyimide tape 3 and a plurality of leads 2 (only eight leads are shown) joined onto the upper surface of the polyimide tape 3. Hereupon, an inner end of each of the leads 2 is connected to one of connecting pads (not shown) of the semiconductor chip 1 corresponding thereto via a bump 4, the connecting pads being provided on the upper surface of the semiconductor chip 1. Each of the connecting pads is made of electrically conductive material, for example aluminum, copper and so on. Further, the polyimide tape 3 comprises a facing portion 3a which is situated so as to face to the upper surface of the semiconductor chip 1, and two void portions 3b each of which is formed so as to expose the connecting pads upward on condition that the semiconductor chip 1 is connected to the tape carrier structure T1.

Hereupon, some of the connecting pads (four pads) are disposed near a shorter side of the rectangular semiconductor chip 1 in a row parallel to the shorter side, while the remainders (four pads) are disposed near the opposite shorter side in a row parallel to the shorter side. Then, the semiconductor chip 1 is disposed with respect to the tape carrier structure T1 such a situation that its shorter sides are parallel to the width direction of the polyimide tape 3 (right-left direction in FIGS. 1A and 2A). Hereinafter, in the sake of convenience, the above-mentioned direction is referred to "the first direction". Further, the longitudinal direction of the polyimide tape 3, which is perpendicular to the first direction, is referred to "the second direction".

Thus, the outer portion (main portion) of each of the leads 2 extends in the first direction, while the inner portion of the leads 2 is disposed so as to be connected to one of the connecting pads corresponding thereto. Further, the inner portion of the lead 2 extends in the second direction from the position of the connecting pad corresponding thereto and then rectangularly bends to the first direction so as to be united with the outer portion of the lead 2 corresponding thereto.

Figure 2A:
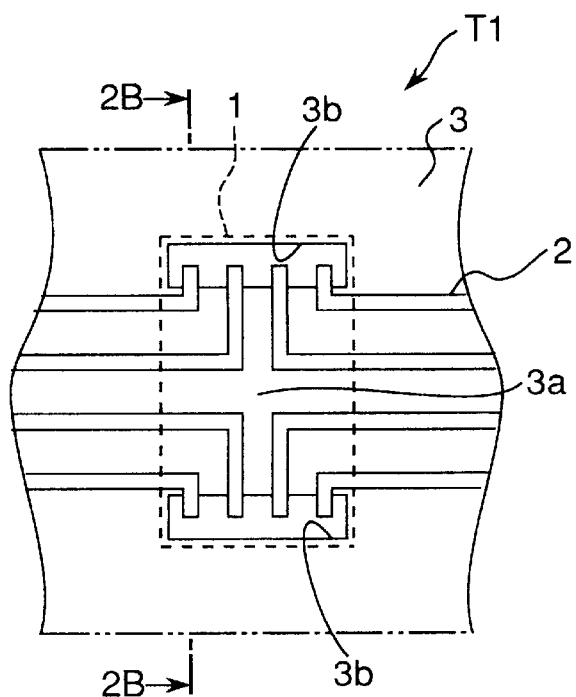
FIG. 2A is a top plan view of the tape carrier structure on condition that a semiconductor chip is connected thereto.
Figure 2B:
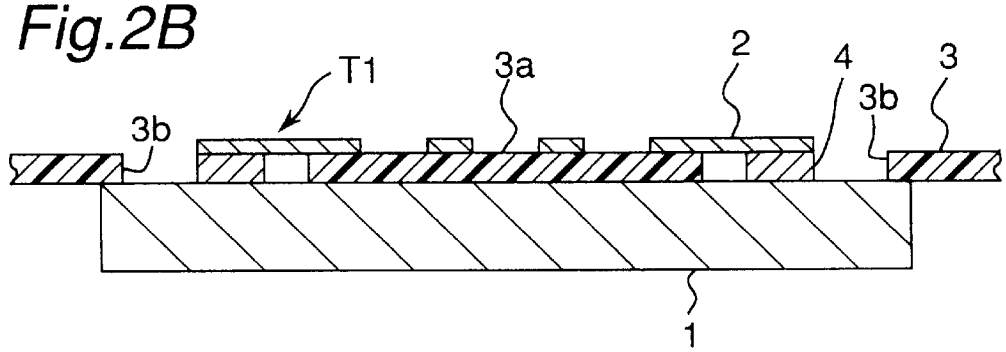
FIG. 2B is a sectional view along line 2B—2B of FIG. 2A illustrating the tape carrier structure.

In the tape carrier structure T1 to which the semiconductor chip 1 is connected, as apparent from FIG. 2B, the facing portion 3a of the polyimide tape 3 is provided between the leads 2 and the semiconductor chip 1 so that the leads 2 are electrically insulated against the semiconductor chip 1 by the facing portion 3a, and also the void space between the leads 2 and the semiconductor chip 1 is filled with the facing portion 3a. Therefore, according to the embodiment, each of the leads 2 scarcely moves in upward and downward direction so as to be prevented from contacting to the semiconductor chip 1, in time of a molding step in which a part of the tape carrier structure T1 around the semiconductor chip 1 and the semiconductor chip 1 are molded together by a resin mold 6 (see FIG. 4). Then, an occurrence of a short circuit between the semiconductor chip 1 and each of the leads 2 is surely prevented. In contrast, according to the conventional tape carrier structure, as mentioned formerly, if a force is applied to the leads 2 in time of the molding step, the leads 2 move easily in upward and downward direction so as to contact to the semiconductor chip 1. Thus, according to the tape carrier structure T1, the occurrence rate of inferior products is effectively reduced so that the quality of the tape carrier package is highly improved and also the manufacturing cost of the tape carrier package is reduced.

Figure 7:
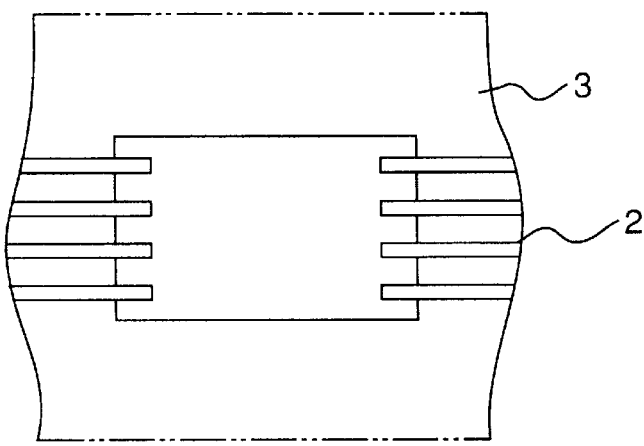
FIG. 7 is a top plan view of a conventional tape carrier structure (A-type)

Still further, in the tape carrier structure T1, since the leads 2 do not contact to the surface of the semiconductor chip 1 except the void portions 3b, the leads 2 can be disposed in any desired layout pattern without contacting to the semiconductor chip 1. More concretely, the tape carrier structure T1, which is usable in stead of the conventional A-type tape carrier structure as shown in FIG. 7, can be used for the tape carrier package on which the rectangular semiconductor chip 1 having the connecting pads near the both opposite shorter sides thereof is mounted. Hereupon, the outer shape of the tape carrier structure T1 (for example, the width of the polyimide tape 3, the intervals among the lead outer portions one another and so on) is set up in the same manner as the conventional B-type tape carrier structure as shown in FIG. 8.

Figure 8:
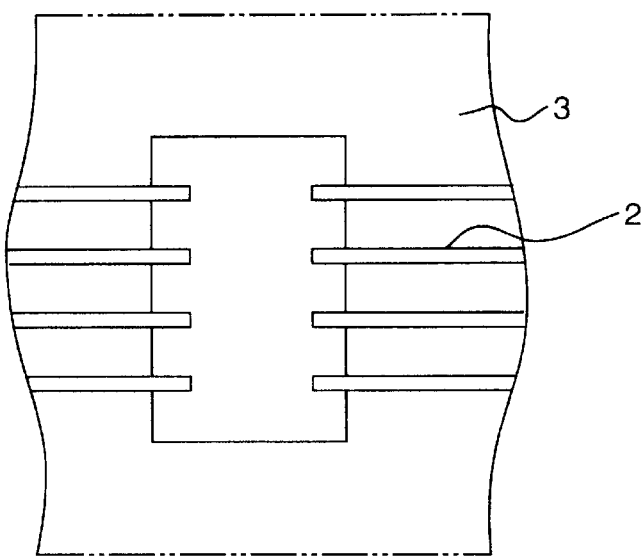
FIG. 8 is a top plan view of another conventional tape carrier structure (B-type).

Consequently, it is preferable to use the tape carrier structure according to the present invention as shown in FIGS. 1A to 2B in such case that the rectangular semiconductor chip 1 has the connecting pads near the shorter sides thereof, on the other hand, use the conventional tape carrier structure as shown in FIG. 8 in such case that the rectangular semiconductor chip has the connecting pads near the longer sides thereof. In that case, the shape of the tape carrier package is identical regardless of whether the connecting pads are disposed near the shorter sides or near the longer sides.

As mentioned formerly, in the conventional tape carrier package, even if the shape of the semiconductor chip 1 is identical, the outer shape of the package differs due to a matter whether the connecting pads are disposed near the shorter sides or near the longer sides. However, in the tape carrier package in which the tape carrier structure according to the present invention is used, the outer shape of the tape carrier package is identical regardless of the position of the connecting pads so that the step of loading the tape carrier package to a substrate is highly simplified.

In the embodiment, the outer shape of the tape carrier package is unified to the shape of the tape carrier package in which the conventional B-type tape carrier structure is used. However, it is possible to unify the outer shape of the tape carrier package to the shape of the tape carrier package in which the conventional A-type tape carrier structure is used.

Figure 2C:
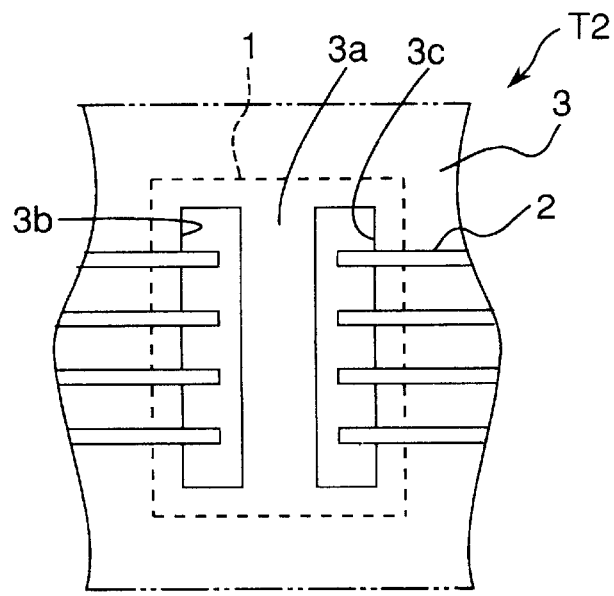
FIG. 2C is a top plan view of another tape carrier structure according to the present invention.

In FIG. 2C (a top plan view), there is shown another type of tape carrier structure T2 illustrating another embodiment according to the present invention.

As shown in FIG. 2C, in the tape carrier structure T2, some of the connecting pads (four pads) are disposed near a longer side of the semiconductor chip 1 in a row parallel to the longer side, while the remainders (four pads) are disposed near the opposite longer side in a row parallel to the longer side. Then, the semiconductor chip 1 is disposed with respect to the tape carrier structure T2 such a situation that its shorter sides are parallel to the first direction, as well as the case shown in FIGS. 1A to 2B. Thus, each of the leads 2 entirely extends in the first direction, the inner end of the lead 2 being connected to one of the connecting pads corresponding thereto.

In the tape carrier structure T2 to which the semiconductor chip 1 is connected, as apparent from FIG. 2C, the facing portion 3a of the polyimide tape 3 is provided between the leads 2 and the semiconductor chip 1, as well as the case shown in FIGS. 1A to 2B, so that the leads 2 are electrically insulated against the semiconductor chip 1 by the facing portion 3a, and also the void space between the leads 2 and the semiconductor chip 1 is filled with the facing portion 3a. Therefore, each of the leads 2 scarcely moves in upward and downward direction so as to be prevented from contacting to the semiconductor chip 1, in time of the molding step. Then, an occurrence of a short circuit between the semiconductor chip 1 and each of the leads 2 is surely prevented.

Consequently, it is more preferable to use the tape carrier structure T1 as shown in FIGS. 1A to 2B in such case that the semiconductor chip 1 has the connecting pads near the shorter sides thereof, on the other hand, use the tape carrier structure T2 as shown in FIG. 2C in such case that the semiconductor chip 1 has the connecting pads near the longer sides thereof. If so, the shape of the tape carrier package is identical regardless of whether the connecting pads are disposed near the shorter sides or near the longer sides. Thus, the outer shape of the package is identical regardless of the position of the connecting pads so that the step of loading the tape carrier package to a substrate is more highly simplified.

Figure 3:
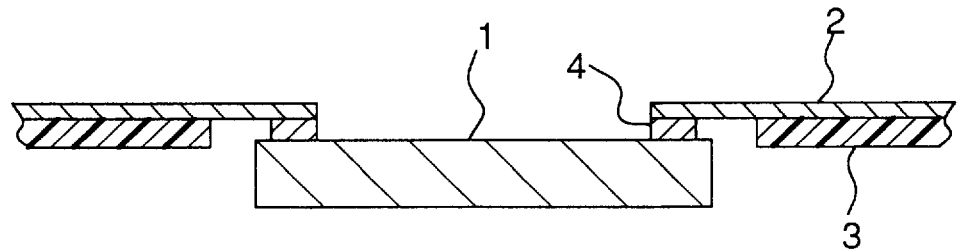
FIG. 3 is a sectional view of a conventional tape carrier structure on condition that a semiconductor chip is connected thereto.
Figure 4:
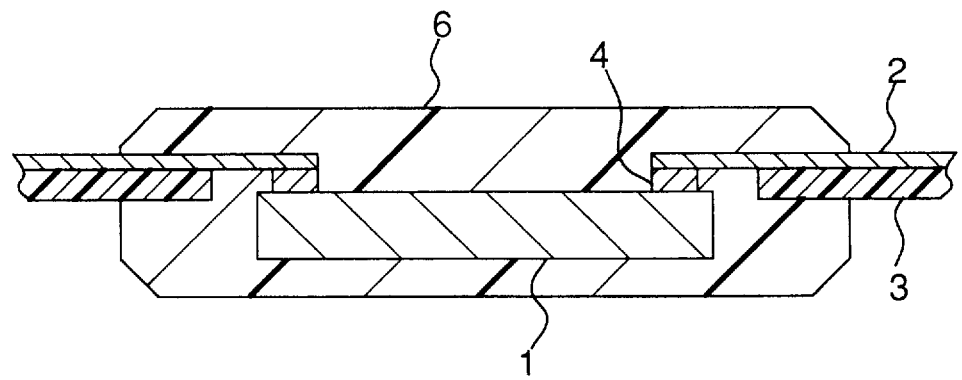
FIG. 4 is a sectional view of a tape carrier package in which the tape carrier structure shown in FIG. 3 is used.
Figure 5:
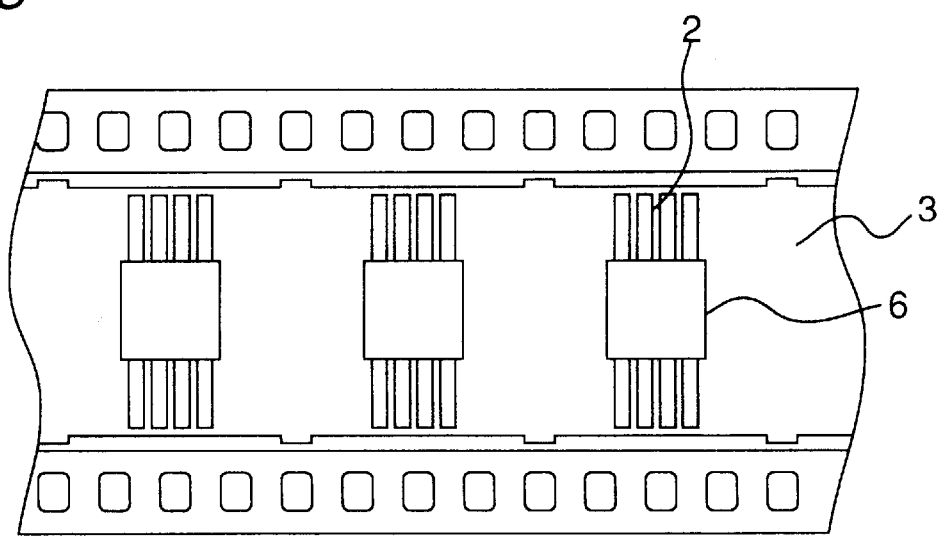
FIG. 5 is a top plan view of the tape carrier package shown in FIG. 4.
Figure 6:
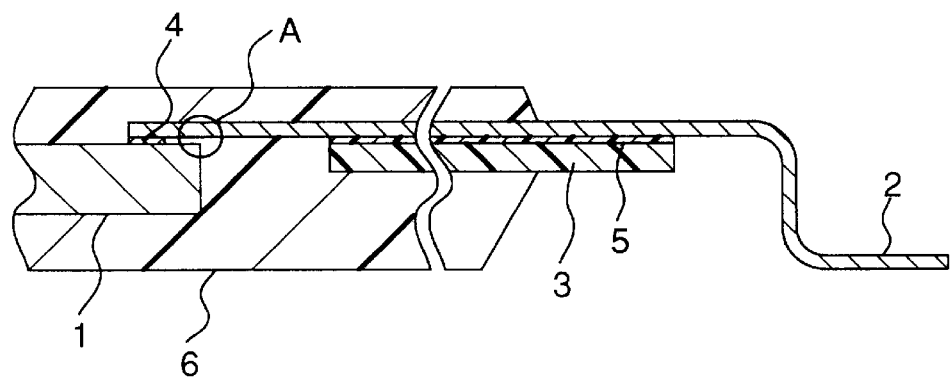
FIG. 6 is an enlarged sectional view of the tape carrier package shown in FIG. 4.

In addition, as apparent from FIG. 3, in the conventional tape carrier structure to which the semiconductor chip 1 is connected, since the polyimide tape 3 is not disposed on (or above) the upper surface of the semiconductor chip 1, the thickness of the polyimide tape 3 substantially exerts no influence on the thickness of the tape carrier package in which the tape carrier structure is used. In contrast, as apparent from FIGS. 1A to 2C, in the tape carrier structure T1,T2 according to the present invention to which the semiconductor chip 1 is connected, since the polyimide tape 3 (facing portion 3a) is disposed on (or above) the upper surface of the semiconductor chip 1, the thickness of the polyimide tape 3 exerts an direct influence on the thickness of the tape carrier package in which the tape carrier structure T1 or T2 is used. Therefore, in order to prevent an unnecessary increase of the thickness of the tape carrier package, it is necessary that the thickness of the polyimide tape 3 is less than or equal to the height (thickness) of the bump 4.

Thus, it is preferable that the thickness of the polyimide tape 3 is less than or equal to 50 $\mu$m, as well as the height of the bump 4. In that case, it is possible to make a thin tape carrier package whose thickness is less than or equal to 0.5 mm, as well as the conventional one.

Although the present invention has been described in terms of preferred embodiments, it will be apparent to those of skill in the art that numerous variations and modifications may be made without departing from the true spirit and scope thereof, as set forth in the following claims.

What is claimed is:

1. A tape carrier structure for a tape carrier package on which at least one semiconductor chip is mounted, said tape carrier structure comprising:

a polyimide tape leads joined onto said polyimide tape, an inner end of each of said leads being connected to one of a plurality of connecting portions of said semiconductor chip corresponding thereto, said connecting portions being provided on a first surface of said semiconductor chip, said polyimide tape covering the entire first surface of said semiconductor chip except at void portions aligned with said connecting portions.

2. The tape carrier structure recited in claim 1, wherein an outer portion of each of said leads extends in a first direction of said polyimide tape;

said connecting portions of said semiconductor chip being situated near an end of said semiconductor chip along a second direction perpendicular to the first direction; and wherein an inner portion of each of said leads extends in the second direction from one of said connecting portions corresponding thereto and then bends to the first direction so as to be united with the outer portion of one of said leads corresponding thereto.

3. The tape carrier structure recited in claim 1, characterized in that:

each of said leads extends in a first direction of said polyimide tape; and said connecting portions of said semiconductor chip are situated near an end of said semiconductor chip in regard to the first direction on condition that said semiconductor chip is mounted on said tape carrier package.

4. The tape carrier structure recited in claim 2, characterized in that the first direction is substantially a width direction of said polyimide tape.

5. The tape carrier structure recited in claim 3, characterized in that the first direction is substantially a width direction of said polyimide tape.

6. The tape carrier structure recited in claim 1, characterized in that said leads are made of copper.

7. The tape carrier structure recited in claim 2, characterized in that said leads are made of copper.

8. The tape carrier structure recited in claim 3, characterized in that said leads are made of copper.

9. The tape carrier structure recited in claim 1, characterized in that:

some of said connecting portions are disposed near a side of said semiconductor chip, while remainders of said connecting portions are disposed near an opposite side of said side; and each of said leads is disposed so as to be connected to one of said connecting portions corresponding thereto.

10. The tape carrier structure recited in claim 2, characterized in that:

some of said connecting portions are disposed near a side of said semiconductor chip, while remainders of said connecting portions are disposed near an opposite side of said side; and each of said leads is disposed so as to be connected to one of said connecting portions corresponding thereto.

11. The tape carrier structure recited in claim 3, characterized in that:

some of said connecting portions are disposed near a side of said semiconductor chip, while remainders of said connecting portions are disposed near an opposite side of said side; and each of said leads is disposed so as to be connected to one of said connecting portions corresponding thereto.

12. The tape carrier structure recited in claim 1, wherein a thickness of said polyimide tape is less than or equal to 50 $\mu$m.

13. The tape carrier structure recited in claim 2, wherein a thickness of said polyimide tape is less than or equal to 50 $\mu$m.

14. The tape carrier structure recited in claim 3, wherein a thickness of said polyimide tape is less than or equal to 50 $\mu$m.

15. The tape carrier structure recited in claim 1, said polyimide tape void portions having a substantially rectangular shape.

* * * * *